United States Patent
Niedermann et al.

[11] Patent Number: 6,140,579
[45] Date of Patent: Oct. 31, 2000

[54] ELECTRIC APPLIANCE HOUSING, ESPECIALLY FOR A CONSUMPTION METER

[75] Inventors: Thomas Niedermann, Zug, Switzerland; Johann Regn, Hartenstein; Markus Roth, Speickersdorf, both of Germany

[73] Assignee: Siemens Aktiengesellschaft, Munich, Germany

[21] Appl. No.: 09/405,917

[22] Filed: Sep. 24, 1999

Related U.S. Application Data

[63] Continuation of application No. PCT/DE98/00723, Mar. 11, 1998.

[30] Foreign Application Priority Data

Mar. 24, 1997 [DE] Germany .............................. 197 12 239

[51] Int. Cl.[7] ...................................................... H02G 3/14
[52] U.S. Cl. ........................ 174/52.1; 361/641; 361/659; 361/664; 174/66
[58] Field of Search ................................. 174/52.1, 50.6, 174/50.61, 50.62, 66; 220/3.8, 241; 361/641, 659, 664

[56] References Cited

U.S. PATENT DOCUMENTS

| | | | |
|---|---|---|---|
| 3,452,148 | 6/1969 | Schmitt et al. ........................... | 174/52 |
| 5,245,507 | 9/1993 | Ericksen ................................... | 361/641 |
| 5,781,410 | 7/1998 | Keown et al. .......................... | 361/690 |
| 5,918,763 | 7/1999 | Hara et al. ............................... | 220/788 |

FOREIGN PATENT DOCUMENTS

| | | |
|---|---|---|
| 38 28 650 A1 | 3/1990 | Germany . |
| 90 17 103 | 4/1991 | Germany . |
| 41 11 263 A1 | 10/1992 | Germany . |
| 297 03 974 U | 4/1997 | Germany . |
| 683 660 A5 | 4/1994 | Switzerland . |

OTHER PUBLICATIONS

International Publication No. WO 93/18410 (Smyth), dated Sep. 16, 1993.

Primary Examiner—Dean A. Reichard
Assistant Examiner—W. David Walkenhorst
Attorney, Agent, or Firm—Herbert L. Lerner; Laurence A. Greenberg; Werner H. Stemer

[57] ABSTRACT

An electric appliance housing, especially for a consumption meter, includes a base part and a closure part which are each molded in one piece from synthetic material and which can be secured by a lead seal, in a closed position. The closure part can be snap-fixed to the base part. The base part passes through the closure part with a lead-seal carrier which is molded on in one piece and which carries an eyelet in its projecting region as a passage for a lead-seal wire.

14 Claims, 8 Drawing Sheets

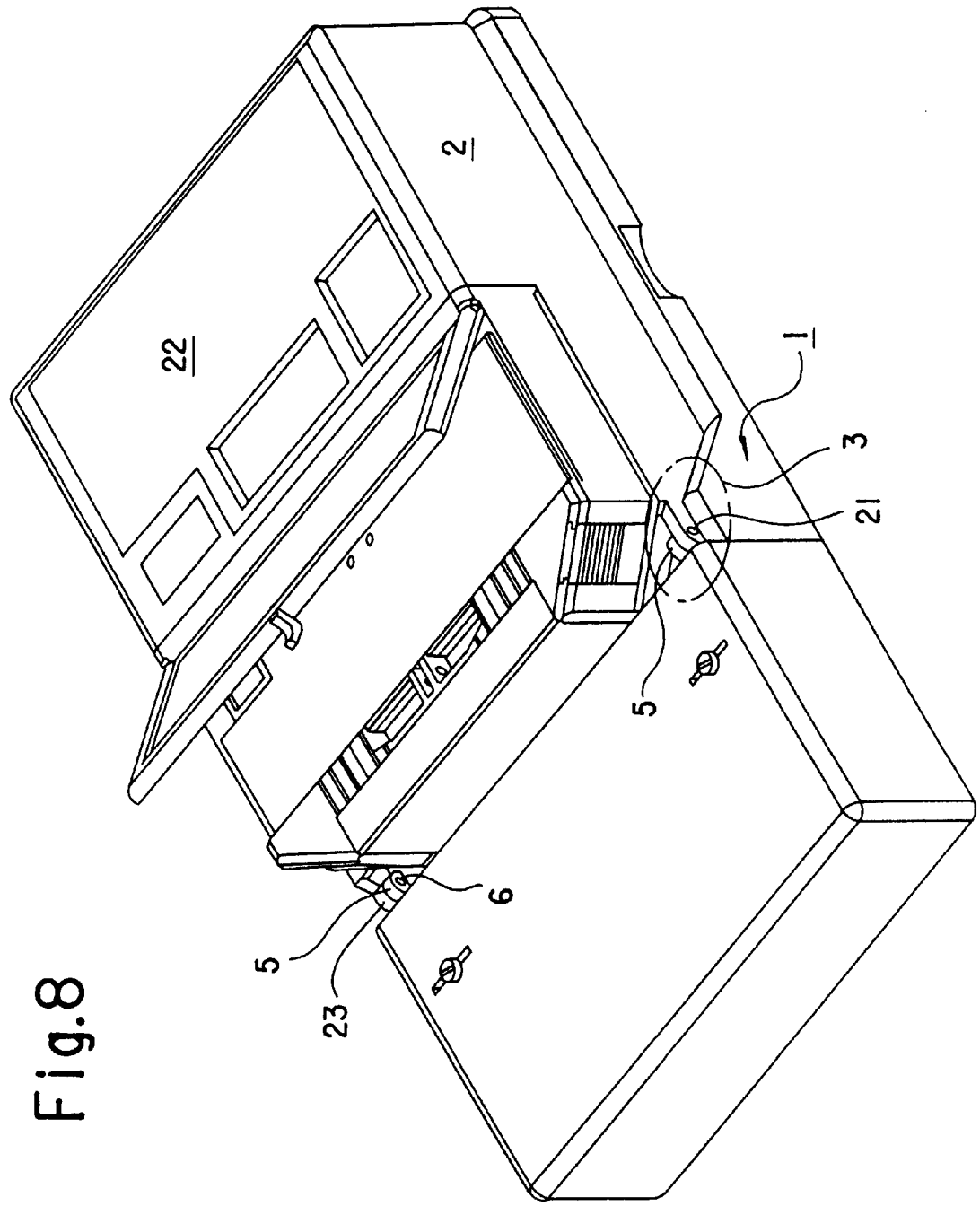

ELECTRIC APPLIANCE HOUSING, ESPECIALLY FOR A CONSUMPTION METER

CROSS-REFERENCE TO THE REALTED APPLICATION:

This application is a continuation of copending International Application No. PCT/DE98/00723, filed Mar. 11, 1998, which designated the United States.

BACKGROUND OF THE INVENTION

1. Field of the Invention

The invention relates to an electric appliance housing, especially for a consumption meter, having a base part which is molded from synthetic material and a closure part which is molded from synthetic material, which can be fixed to the base part and which can be secured by a lead seal in a closed position relative to the base part.

In electricity meters of the type mentioned above and known from practice, the closure part is formed by a hood. The housing has a rectangular shape in outline. In a mounted state of use, longer rectangular sides of an outline of the base part run vertically and, in that mounted state of use, a lower narrow side of a transducer is a distribution side, to which a distribution strip for line connections is generally fitted. While the distribution strip for the line connections is freely accessible at all times, an interspace above that strip, formed between the closure part and the base part and covered by the closure part, is sealed with a lead seal when it is closed, in order to make it accessible only to authorized persons in a manner which can be checked.

In the case of the known consumption meters, the closure part is screwed to the base part, and at least one of the screws is sealed to the closure part through the use of a lead seal when the screw is tightened. For that purpose, the connecting screw is provided with a through hole in its screw head. The hole runs transversely to the screw axis, as a passage for a lead-seal wire. In the lead-sealing position, that through hole corresponds with an eyelet fitted to the closure part. The lead-seal wire is led through the through hole and the eyelet. That makes it possible, for example, to check whether or not the meter housing has been opened by unauthorized persons.

Swiss Patent CH 683 660 A5 discloses a consumption meter as described initially above, which can be sealed with a lead seal.

German Utility Model G 90 17 103.9 reveals a plastics or synthetic-material housing which includes a base part and a closure part. The two parts are fixed with a snap action and are able to be sealed with a lead seal.

German Published, Non-Prosecuted Patent Application DE 41 11 263 A1 shows a two-part covering hood, which can be sealed with a lead seal, for an electric appliance. When the covering hood is closed, extensions on an upper part and on a lower part, each having an opening, are located opposite each other. A lead-seal wire can be pulled through those openings.

SUMMARY OF THE INVENTION

It is accordingly an object of the invention to provide an electric appliance housing, especially for a consumption meter, which overcomes the hereinafore-mentioned disadvantages of the heretofore-known devices of this general type and which is simplified with regard to its construction and its mounting properties.

With the foregoing and other objects in view there is provided, in accordance with the invention, an electric appliance housing, especially for a consumption meter, comprising a base part molded from synthetic material; and a closure part molded from synthetic material and having an outer wall, the closure part to be snap-fixed to the base part and secured in a closed position relative to the base part by a lead seal; the base part having a lead-seal carrier molded on in one piece, passing through the closure part and projecting beyond the outer wall of the closure part, the lead-seal carrier having a projecting region carrying an eyelet as a passage for a lead-seal wire.

Both the base part and the closure part are components molded in one piece from plastics or synthetic material in an integral structure. The snap-action fixing provided between these parts means that mounting is made significantly easier. At the end of the snap-action mounting, the lead-seal eyelet is automatically located in an alignment which is suitable for the lead-seal wire to pass through without problems. As a result of positioning the lead-seal carrier in a corner region on the distribution side of the front wall of the closure part, the load-seal wire and the seal take up only an insignificant part of the front area of the distribution housing. The front area can therefore be used to a large extent for an additional fitting, in saddle fashion, of a further appliance, for example a module.

In accordance with still an additional feature of the invention, the base part has a connection or distribution side, the closure part has a front wall with a corner region facing the connection or distribution side, and the lead-seal carrier passes through the front wall in the corner region.

In accordance with another feature of the invention, one lead-seal carrier is fixed indirectly to a base plate of the base part.

In accordance with a further feature of the invention, on strength grounds, the fixing of the lead-seal carrier is carried out through a support part, onto an upper end of which the lead-seal. carrier is molded with a cross-sectional thickness that is smaller than that of the support part.

In accordance with an added feature of the invention, the support part has an additional stabilizing function for the inherent strength of the base plate, and the base plate has side edges, excluding the connection side, which are stabilized by a stiffening edge that projects in the direction of the closure part. The stiffening edge is sealed off by such a support part toward the connection side. This can also be the case on both sides, as will be described below.

In accordance with an additional feature of the invention, the lead-seal carrier on the base plate side has the shape of a tongue-like web with an approximately rectangular cross section.

In accordance with yet another feature of the invention, in order to provide the snap-action connection between the closure plate and the base part, at least one snap-action web, which is equipped with a snap-action hook at the end, projects from the inside of the front plate of the closure part in the direction of a snap-action receiving opening which is cut out of the base plate.

In accordance with yet a further feature of the invention, the base part and the closure part have an approximately rectangular outline with long sides normally aligned vertically in a mounted state of use, the closure part has a top side edge to be form-lockingly clamped to the stiffening edge of the base plate and to be snapped to the base part in the vicinity of the connection side, and the lead-seal carrier has a rectangular cross-sectional shape with long sides aligned approximately parallel to the long sides of the base part in the vicinity of the connection side. A form-locking connection is one which connects two elements together due to the shape of the elements themselves, as opposed to a force-locking connection, which locks the elements together by force external to the elements. In the usual mounted state of use of the meter housing, the eyelet axis of the lead-seal carrier runs horizontally. This makes it particularly simple to insert the lead-seal wire. In this case, it has to be taken in account that sealing with a lead seal often has to be performed under conditions of poor visibility.

In accordance with yet an added feature of the invention, the eyelet has a given axis, and the projecting region of the lead-seal carrier has a rounded off projecting end with a rounding radius having an axis approximately coinciding with or parallel to the given axis. These features facilitate the fitting of the closure part to the base part without any risk of damaging the lead-seal carrier.

In accordance with yet an additional feature of the invention, the closure part has an outside having a through opening formed therein for the lead-seal carrier and carrying a mating eyelet aligned to correspond to the eyelet of the carrier for jointly receiving the lead-seal wire. These features in turn serve to simplify the insertion of the lead-seal wire into the eyelet of the lead-seal carrier and into the mating eyelet on the closure part.

In accordance with again another feature of the invention, the projecting region of the lead-seal carrier has a projecting end, and the mating eyelet forms a tangent with the projecting end.

In accordance with a concomitant feature of the invention, there is provided a module to be fitted in saddle fashion to the closure part, the module having a mating eyelet, the front wall of the closure part having another corner region facing the connection side, a further lead-seal carrier disposed in the other corner region, and the further lead-seal carrier having an eyelet for fitting a lead seal to the mating eyelet of the module. This feature prepares the way for an additional module to be accommodated and sealed with a lead seal. As a result of the dual presence of a lead-seal carrier, support parts are provided on both sides of the base part. The base plate is therefore additionally stabilized in the region of the distribution-side ends of its edge reinforcement.

Other features which are considered as characteristic for the invention are set forth in the appended claims.

Although the invention is illustrated and described herein as embodied in an electric appliance housing, especially for a consumption meter, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 8 is a perspective view of the consumption meter according to FIG. 7 with the module fitted and ready to be sealed with a lead seal.

DESCRIPTION OF THE PREFERRED EMBODIMENTS

Figure 7:
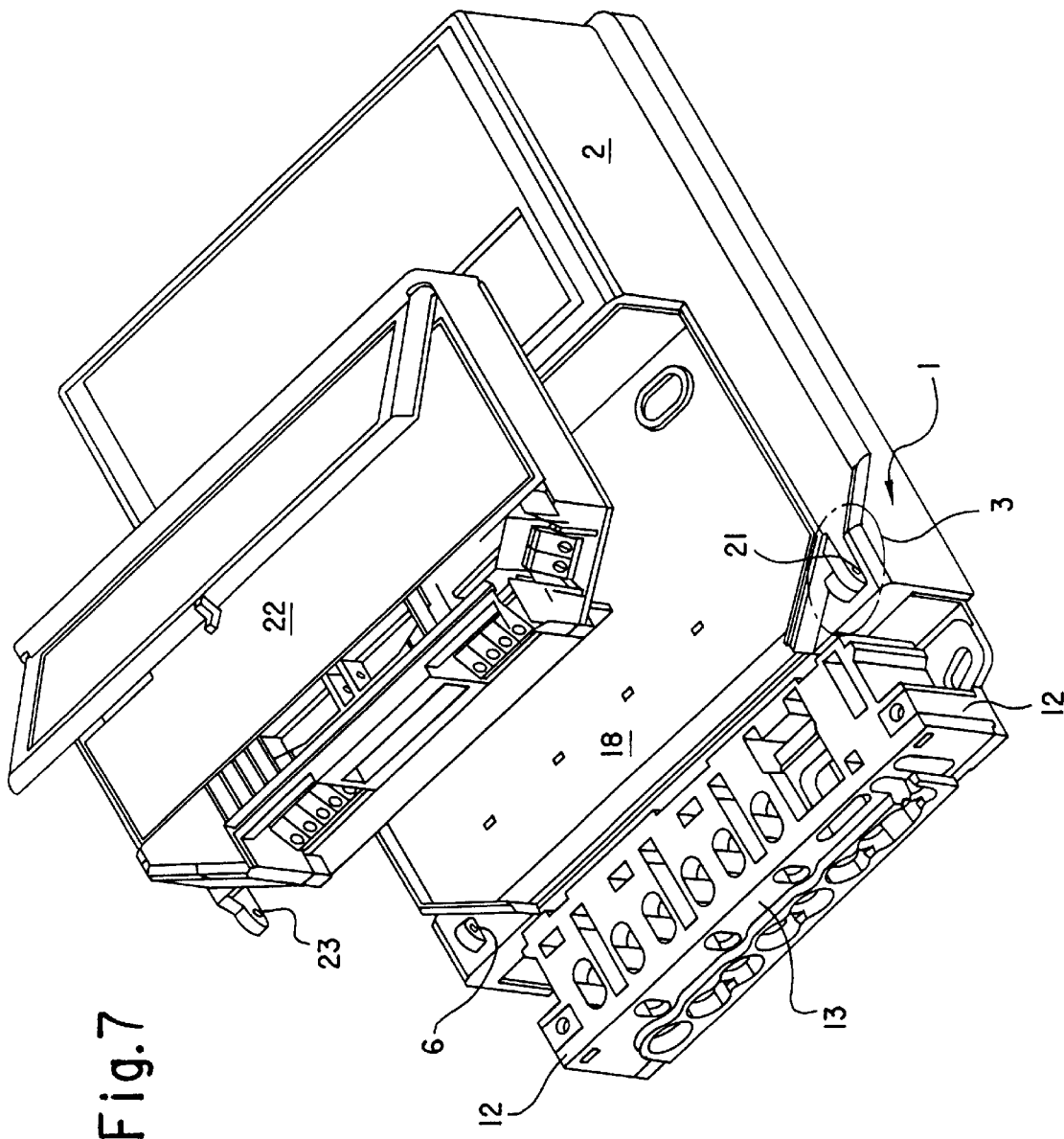
FIG. 7 is an exploded, perspective view of a complete assembly of an electric consumption meter according to the invention with an additional module, in which a closure part of the housing is in a position that is ready to be sealed with a lead seal.

Referring now to the figures of the drawings in detail and first, particularly, to FIGS. 7 and 8 thereof, there is seen a meter housing which includes a base part 1 as well as a closure part 2 that can be put onto the base part 1 in the manner of a hood and can be clamped to the latter. A clamping or closure position of the base part 1 and the closure part 2 shown in FIGS. 7 and 8 can be secured by a lead seal. This fitting of a lead seal takes place outside the closure part 2 in a region identified by a circular region 3 in FIGS. 7 and 8.

A clamping action between the closure part 2 and the base part 1 is carried out through the use of a snap-action fixing which is described further and in more detail below with reference to FIGS. 1 and 2. A lead-seal carrier 4 is used for the purpose of fitting a lead seal in the region 3 of the closure position between the base part 1, and closure part 2. The lead-seal carrier 4 has one end 5 and, in particular, an eyelet 6 disposed therein, which projects through the closure part 2 and through an associated corner region 7 of its front wall 18. The base part 1 and the closure part 2 are formed of plastics or synthetic material and are produced in one piece with their associated functional parts in an integral structure.

The lead-seal carrier 4 is produced in one piece with a base plate 8 of the base part 1. For this purpose, a support or plinth part 9 is provided directly on the base plate 8 and projects beyond the base plate 8 in the direction of the connecting part 2. The lead-seal carrier 4 is molded onto an upper end of the support part 9, facing away from the base plate 8. The lead-seal carrier 4 is provided with a cross-sectional thickness which is considerably smaller than that of the support part 9.

The base plate 8, excluding a connection side 10, is bordered by a stiffening edge 11 which projects in the direction of the closure part 2. For reasons which are described further and in more detail below, in the preferred embodiment two lead-seal carriers 4 and, correspondingly, two support parts 9 are provided, as a result of which two different lead seals are possible. However, they basically have an identical effect in terms of function from the point of view of the concept of the invention.

As is seen in FIG. 7, the base plate 8 carries a connection terminal block 13 fDr line connections on its lower connection side 10 when it is in its state of use in which it is mounted on a building wall. In order to keep an interspace between the base part 1 and the closure part 2 open toward this connection terminal block 13, there is no stiffening edge present there. Projections 12 are likewise molded onto the base plate 8 in one piece and are used for fixing the connection terminal block 13. In any case, the two support parts 9 form a connection-side end of the stiffening edge 11 which, as a result, is constructed to be particularly robust there, and also ensures guidance of the closure part 2 when. it is being fitted onto the base part 1. As a result, the lead-seal carriers 4 are protected against damage. In addition, this ensures that they are threaded reliably into through openings 24 seen in FIG. 4, through which the lead-seal carriers 4 protrude with their ends 5 and, in particular, with the eyelet 6 disposed therein.

The lead-seal carriers 4 have the shape of a tongue-like web with an approximately rectangular cross section. An axis of the eyelet 6 runs parallel to a narrow side of this cross-sectional shape. This ensures that, in the mounted position of use of the meter, the axes of the lead-seal eyelets 6 run parallel to the narrow side of the rectangular cross-sectional shape of the lead-seal carriers 4.

Figure 3:
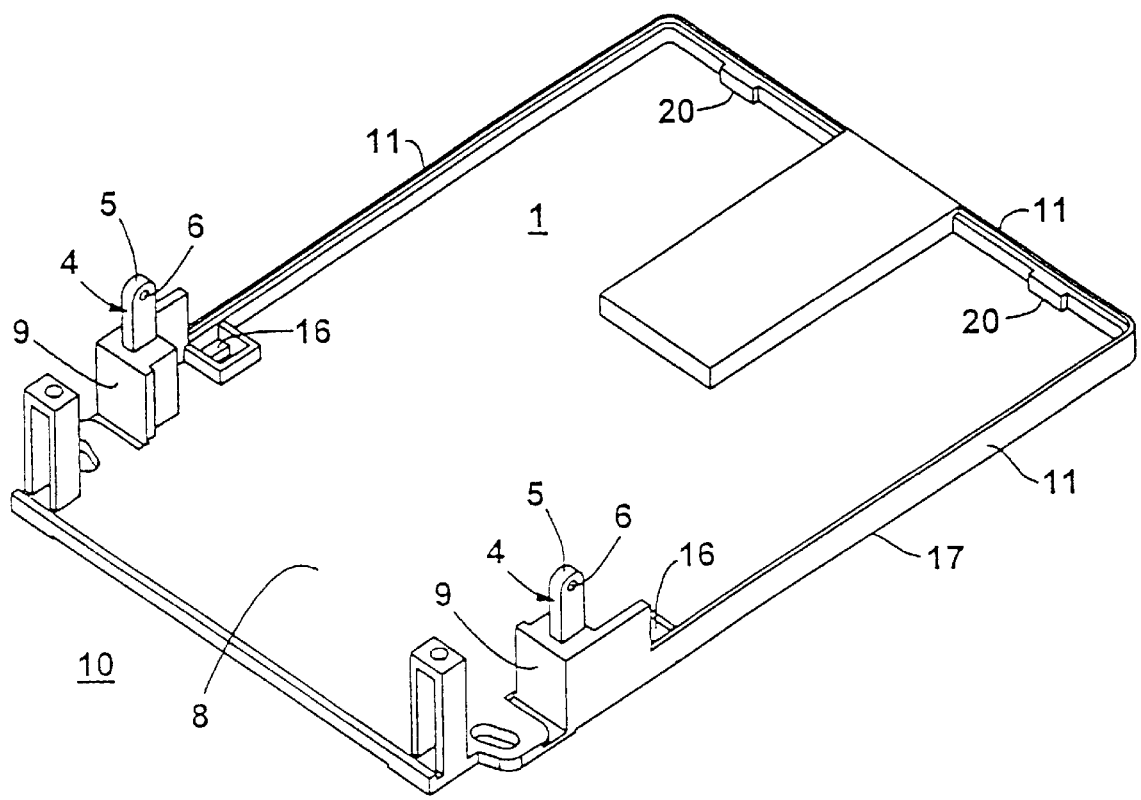
FIGS. 3 and 4 are perspective views of the base part according to FIG. 1 and the closure part according to FIG. 2, which are likewise associated with each other, but with a different viewing perspective.
Figure 5:
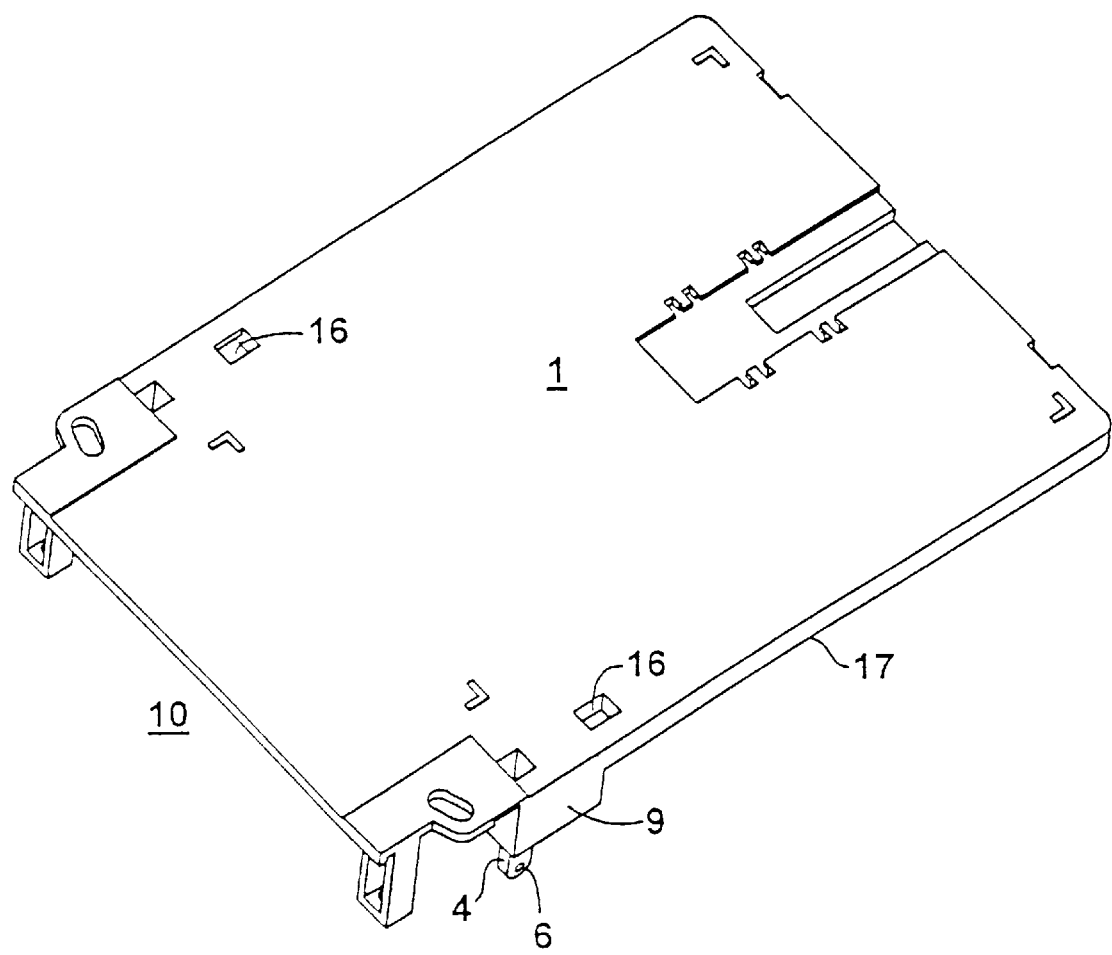
FIGS. 5 and 6 are perspective views of the base part and the closure part that are associated with one another in a viewing perspective which is modified with respect to FIGS. 1–4.
Figure 6:
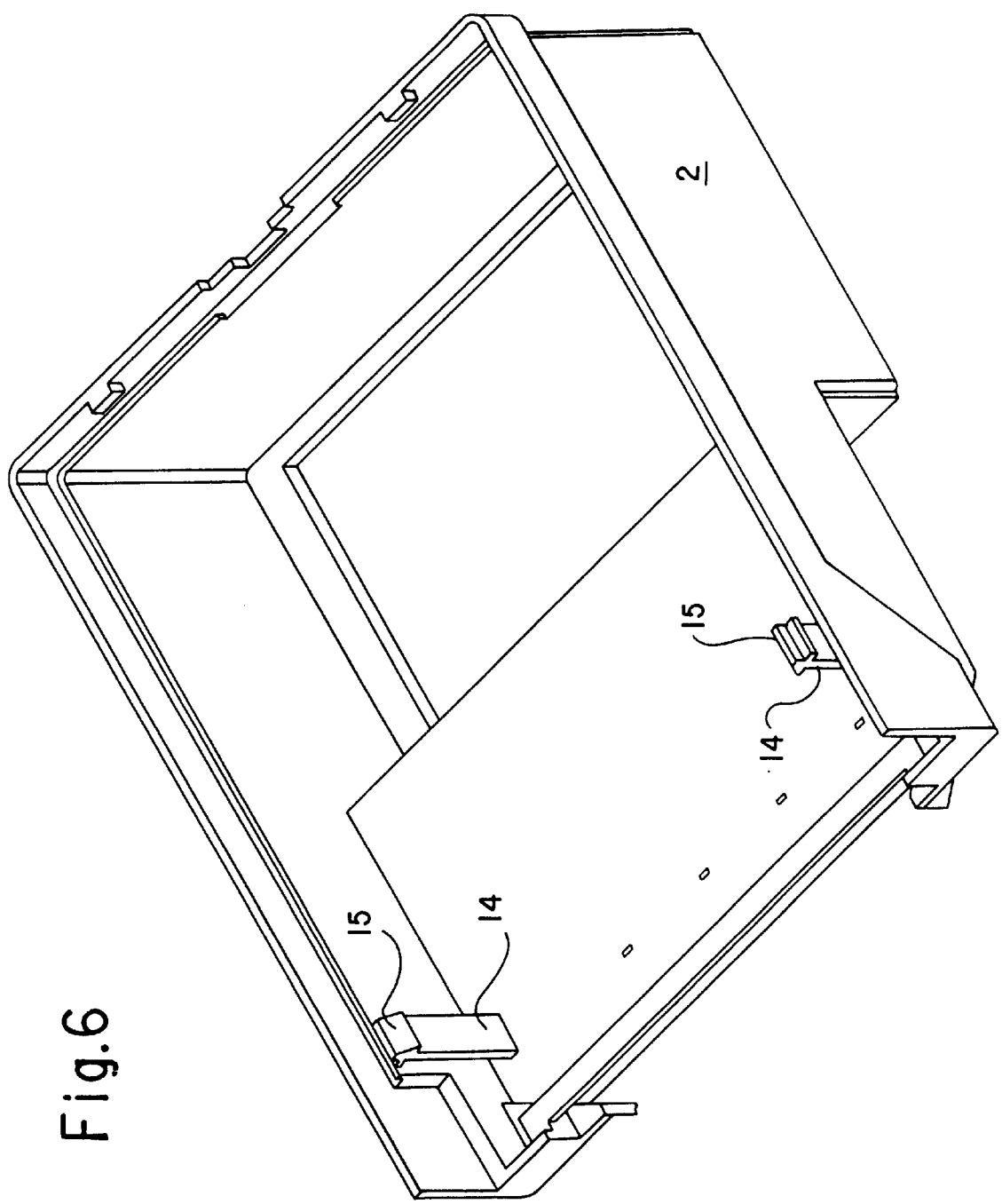

The snap-action fixing of the closure part 2 to the base part 1 is provided by snap-action webs 14 which are fixed to the inside of the front plate 18 and are equipped at the ends with snap-action hooks 15, as is seen in FIG. 6. The snapaction hooks 15 of the snap-action webs 14 project in the direction of snap-action receiving openings 16 that are cut out of the base plate 8 in each case, as is seen in FIGS. 1, 3 and 5.

Figure 1:
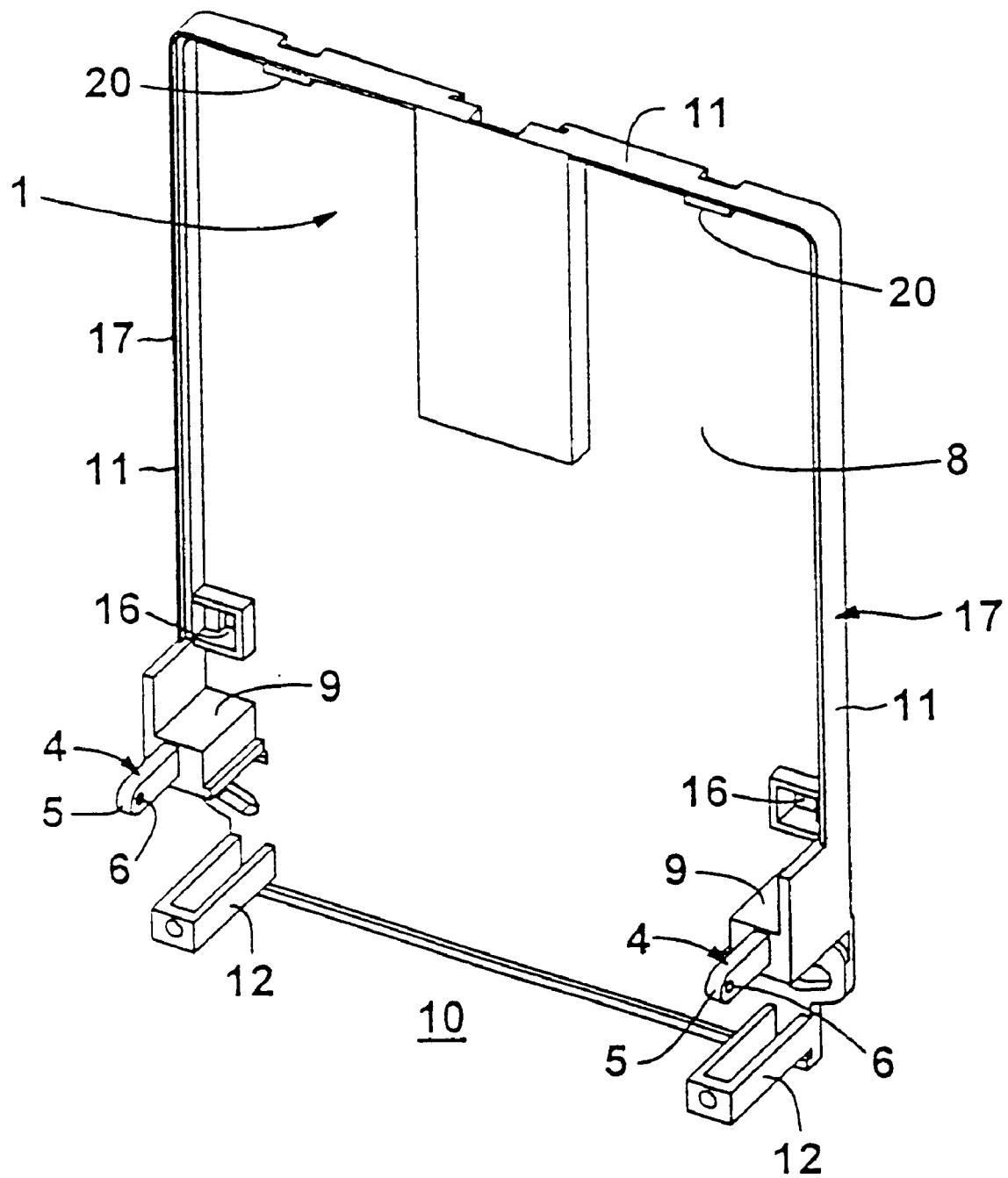
FIG. 1 is a diagrammatic, perspective view of a base part in a normally vertically mounted position of use (fixed to a building wall)
Figure 2:
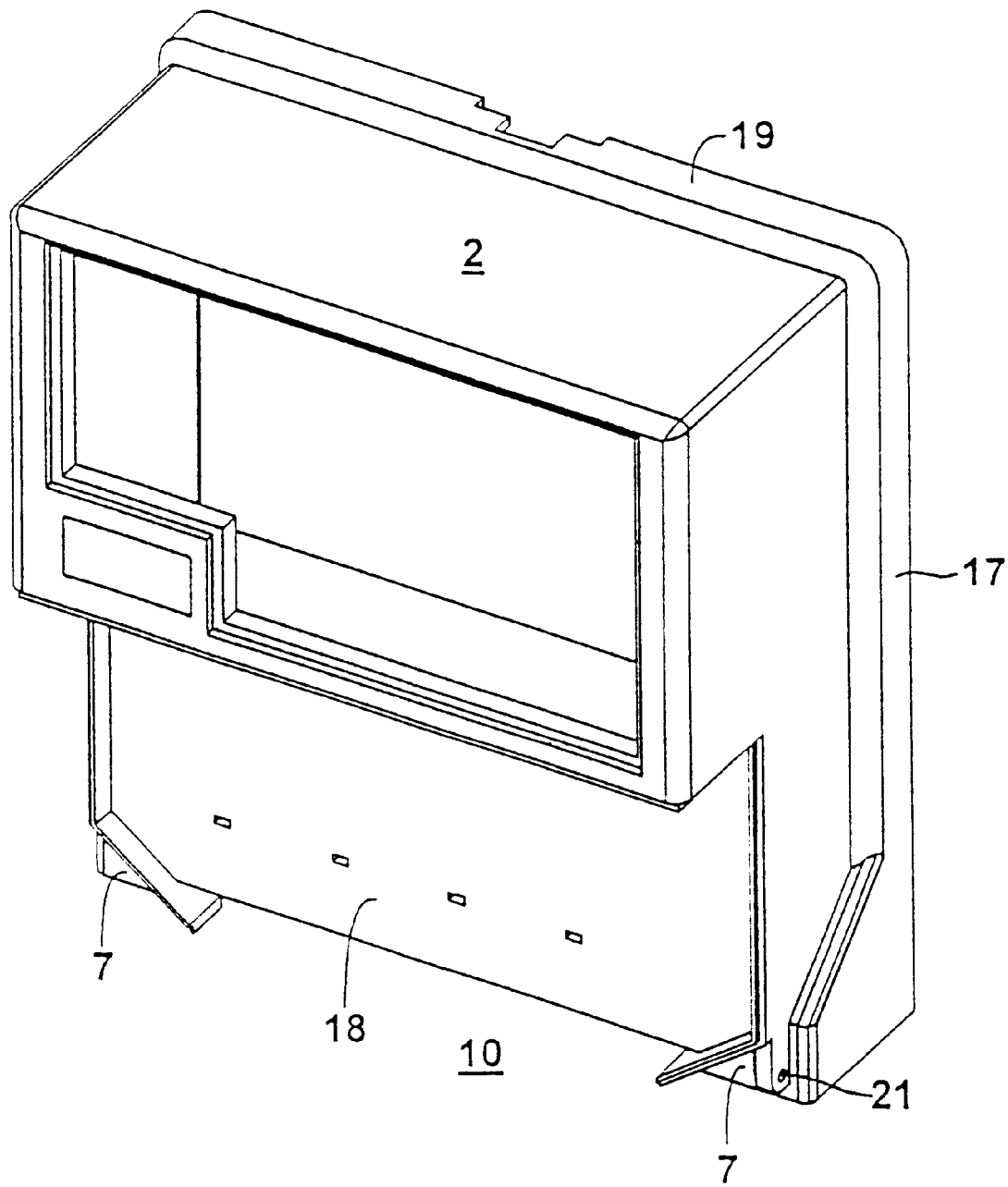
FIG. 2 is a perspective view of a closure part of the consumption meter associated with the base part of FIG. 1.

The base part 1 and accordingly the closure part 2, which has matched dimensions, have an approximately rectangular outline with long sides 17 that are usually aligned vertically in the mounted state of use, as is seen in FIGS. 1 and 2. The closure part 2 has a side edge 19, which is located at the top in the mounted state of use, that can be form-lockingly clamped to the stiffening edge 11 of the base plate 8, which corresponds to the side edge 19. The clamping action takes place behind inwardly directed shaped projections 20 on the stiffening edge 11. The closure part 2 can be snapped to the base part 1 through the use of the snap-action webs 14, in the vicinity of its connection side 10. In the process, the ong sides of the rectangular cross-sectional shape of the lead-seal carriers 4 are aligned approximately parallel to the long sides 17, and they are disposed in the region of the appliance which faces the connection side 10.

The projecting end 5 of the lead-seal carrier 4 is rounded off. An axis of a radius of the rounding approximately coincides with the axis of the eyelet 6 or runs parallel thereto, that is to say it is also parallel to the narrow side of the rectangular cross-sectional shape of the lead-seal carrier 4.

Figure 4:
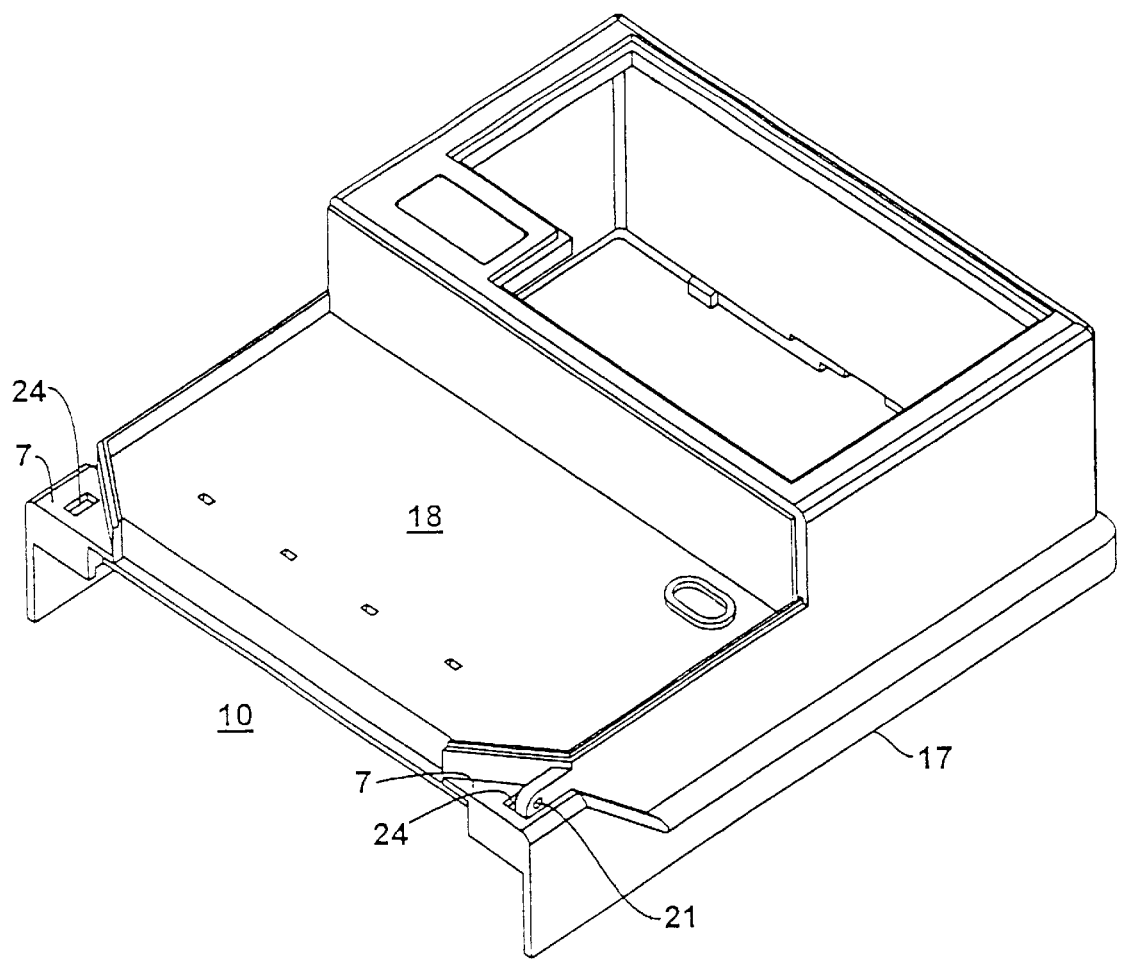

As is seen in FIGS. 2, 4 and 8, in addition to the through opening 24 for one of the snap-action webs 14, the outside of the connecting part 2 contains a first mating eyelet 21, which corresponds to its eyelet 6, in order to jointly receive a lead-seal wire. The first mating eyelet 21 forms a tangent with the projecting end 5 of one of the lead-seal carriers 4. The end 5 of the other lead-seal carrier 4 in the other corner region 7 likewise projects beyond the closure part 2 and is used there for the fitting of a lead seal of a further appliance, specifically a module 22. The module 22 can be fitted in saddle fashion to the closure part 2 of the consumption meter in a special configuration. The module 22 carries a second mating eyelet 23 on one of its sides for the joint fitting of a lead seal to the other of the two lead-seal carriers 4 which project through the closure part 2, as is seen in FIGS. 7 and 8.

We claim:

1. An electric appliance housing, comprising:
   a base part molded from synthetic material; and
   a closure part molded from synthetic material and having an outer wall, said closure part to be snap-fixed to said base part and secured in a closed position relative to said base part by a lead seal;
   said base part having a lead-seal carrier molded on in one piece, passing through said closure part and projecting beyond said outer wall of said closure part, said lead-seal carrier having a projecting region carrying an eyelet as a passage for a lead-seal wire.

2. The housing according to claim 1, wherein said base part has a connection side, said closure part has a front wall with a corner region facing said connection side, and said lead-seal carrier passes through said front wall in said corner region.

3. The housing according to claim 2, wherein said base part has a base plate to which said lead-seal carrier is fixed.

4. The housing according to claim 3, wherein said base part has a support part projecting beyond said base plate toward said closure part, said support part has an upper end and a given cross-sectional thickness, and said lead-seal carrier is molded onto said upper end of said support part and has a cross-sectional thickness smaller than said given cross-sectional thickness.

5. The housing according to claim 4, wherein said base plate has a stiffening edge projecting toward said closure part, and said support part seals off said stiffening edge in the vicinity of said connection side.

6. The housing according to claim 1, wherein said lead-seal carrier has the shape of a tongue-like web with an rectangular cross section having a narrow side, and said eyelet has an axis parallel to said narrow side of said cross-sectional shape.

7. The housing according to claim 3, wherein said front wall of said closure part has an inner surface, at least one snap-action web projects from said inner surface of said front wall toward a snap-action receiving opening formed in said base plate, and said at least one snap-action web has an end with a snap-action hook.

8. The housing according to claim 5, wherein said base part and said closure part have an rectangular outline with long sides normally aligned vertically in a mounted state of use, said closure part has a top side edge to be form-lockingly clamped to said stiffening edge of said base plate and to be snapped to said base part in the vicinity of said connection side, and said lead-seal carrier has a rectangular cross-sectional shape with long sides aligned parallel to said long sides of said base part in the vicinity of said connection side.

9. The housing according to claim 8, wherein said eyelet has a given axis, and said projecting region of said lead-seal carrier has a rounded off projecting end with a rounding radius having an axis coinciding with said given axis.

10. The housing according to claim 8, wherein said eyelet has a given axis, and said projecting region of said lead-seal carrier has a rounded off projecting end with a rounding radius having an axis parallel to said given axis.

11. The housing according to claim 1, wherein said closure part has an outside having a through opening formed therein for said lead-seal carrier and carrying a mating eyelet aligned to correspond to said eyelet of said carrier for jointly receiving the lead-seal wire.

12. The housing according to claim 11, wherein said projecting region of said lead-seal carrier has a projecting end, and said mating eyelet forms a tangent with said projecting end.

13. The housing according to claim 2, including a module to be fitted in saddle fashion to said closure part, said module having a mating eyelet, said front wall of said closure part having another corner region facing said connection side, a further lead-seal carrier disposed in said other corner region, and said further lead-seal carrier having an eyelet for fitting a lead seal to said mating eyelet of said module.

14. An electric consumption meter housing, comprising:
  a base part molded from synthetic material; and
  a closure part molded from synthetic material and having an outer wall, said closure part to be snap-fixed to said base part and secured in a closed position relative to said base part by a lead seal;
  said base part having a lead-seal carrier molded on in one piece, passing through said closure part and projecting beyond said outer wall of said closure part, said lead-seal carrier having a projecting region carrying an eyelet as a passage for a lead-seal wire.

* * * * *